US009024355B2

(12) United States Patent
Chang et al.

(10) Patent No.: US 9,024,355 B2
(45) Date of Patent: May 5, 2015

(54) EMBEDDED PLANAR SOURCE/DRAIN STRESSORS FOR A FINFET INCLUDING A PLURALITY OF FINS

(75) Inventors: Josephine B. Chang, Beford Hills, NY (US); Paul Chang, Mahopac, NY (US); Michael A. Guillorn, Yorktown Heights, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/483,200

(22) Filed: May 30, 2012

(65) Prior Publication Data

US 2013/0320399 A1 Dec. 5, 2013

(51) Int. Cl.
H01L 21/02 (2006.01)
H01L 29/66 (2006.01)
H01L 29/78 (2006.01)

(52) U.S. Cl.
CPC ...... H01L 29/66484 (2013.01); H01L 29/7831 (2013.01)

(58) Field of Classification Search
CPC .............. H01L 21/02381; H01L 21/0254; H01L 21/02505; H01L 33/007; H01L 29/78; H01L 29/513; H01L 29/517; H01L 29/7831; H01L 29/66795; H01L 29/78645; H01L 29/785; H01L 29/66484; H01L 29/0847; H01L 29/6659; H01L 29/66636
USPC ........ 257/190, E21.421, E29.255, 20, 76, 77, 257/368, 613; 977/734, 742, 749, 755, 815, 977/843, 855, 936, 938
See application file for complete search history.

(56) References Cited

U.S. PATENT DOCUMENTS

| 6,413,802 B1 * | 7/2002 | Hu et al. ................ 438/151 |
| 6,815,738 B2 | 11/2004 | Rim |
| 7,314,802 B2 | 1/2008 | Zhu et al. |
| 7,655,511 B2 | 2/2010 | Chidambarrao |
| 7,737,498 B2 | 6/2010 | Chatty et al. |
| 7,872,303 B2 | 1/2011 | Chan et al. |
| 7,915,685 B2 | 3/2011 | Cohen |

(Continued)

OTHER PUBLICATIONS

Office Action dated Feb. 11, 2015 received in U.S. Appl. No. 14/076,387.

*Primary Examiner* — Ori Nadav
*Assistant Examiner* — Ernest Allen, III
(74) *Attorney, Agent, or Firm* — Scully, Scott, Murphy & Presser, P.C.; Yuanmin Cal

(57) ABSTRACT

Fin-defining mask structures are formed over a semiconductor material layer having a first semiconductor material and a disposable gate structure is formed thereupon. A gate spacer is formed around the disposable gate structure and physically exposed portions of the fin-defining mask structures are subsequently removed. The semiconductor material layer is recessed employing the disposable gate structure and the gate spacer as an etch mask to form recessed semiconductor material portions. Embedded planar source/drain stressors are formed on the recessed semiconductor material portions by selective deposition of a second semiconductor material having a different lattice constant than the first semiconductor material. After formation of a planarization dielectric layer, the disposable gate structure is removed. A plurality of semiconductor fins are formed employing the fin-defining mask structures as an etch mask. A replacement gate structure is formed on the plurality of semiconductor fins.

20 Claims, 16 Drawing Sheets

(56) References Cited

U.S. PATENT DOCUMENTS

| | | |
|---|---|---|
| 7,993,988 B2 | 8/2011 | Juengling |
| 8,039,349 B2 | 10/2011 | Hargrove et al. |
| 2005/0145941 A1* | 7/2005 | Bedell et al. .................. 257/348 |
| 2007/0148837 A1* | 6/2007 | Shah et al. .................... 438/164 |
| 2009/0061572 A1 | 3/2009 | Hareland et al. |
| 2010/0038679 A1* | 2/2010 | Chan et al. .................... 257/190 |
| 2011/0073951 A1 | 3/2011 | Chatty et al. |
| 2011/0284967 A1 | 11/2011 | Cheng et al. |

\* cited by examiner

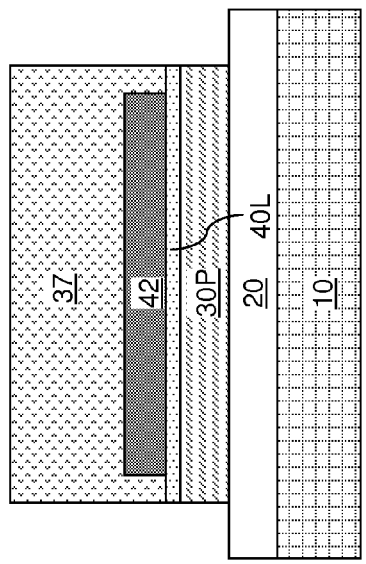# 
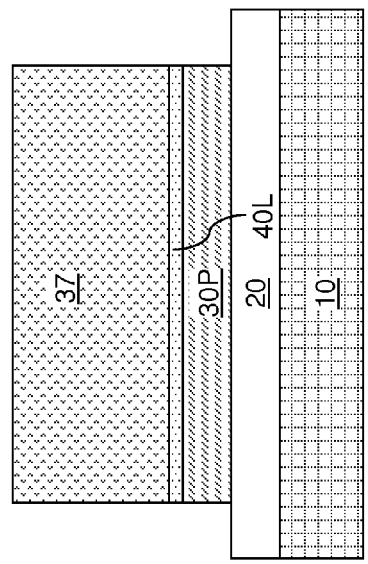
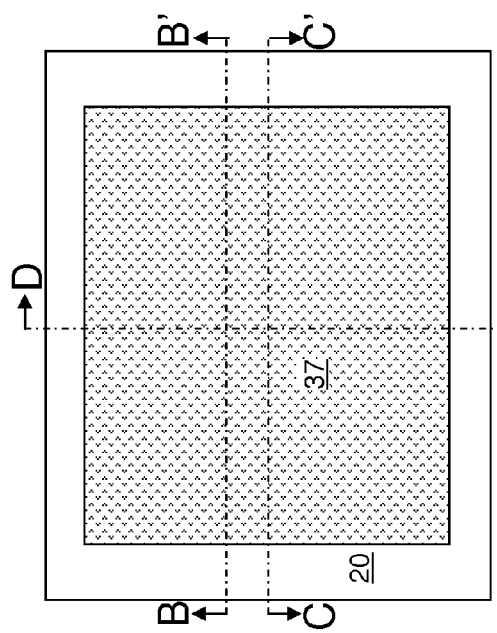
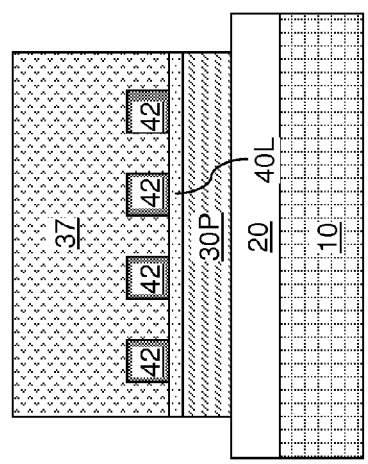

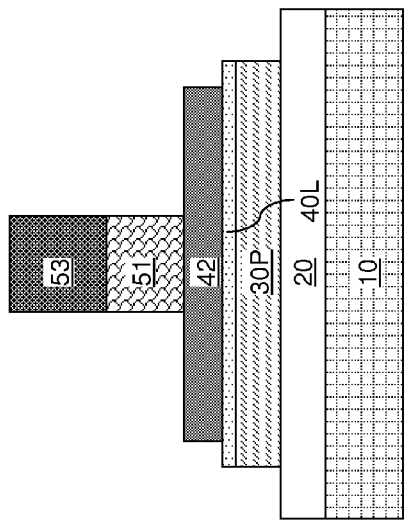
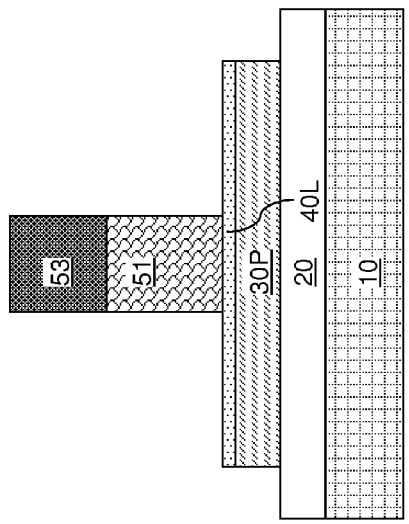
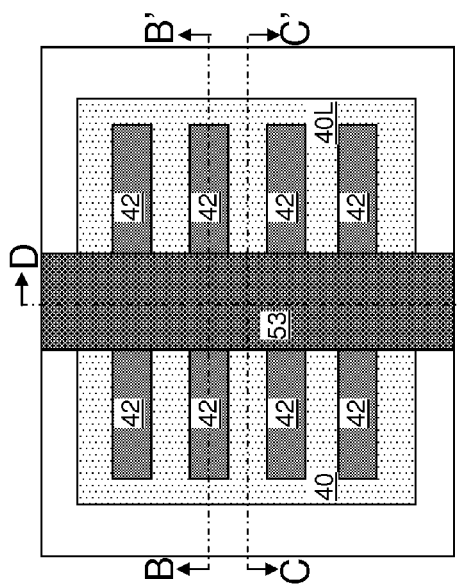
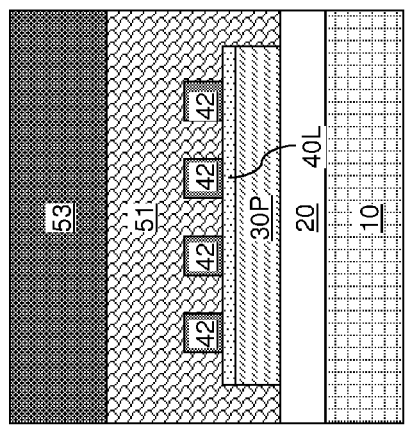

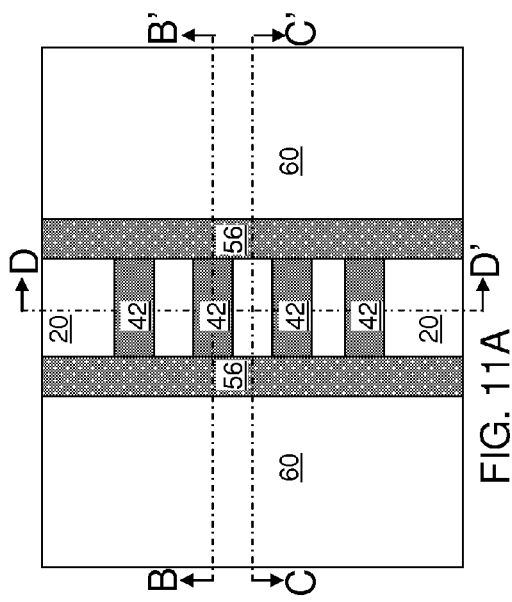
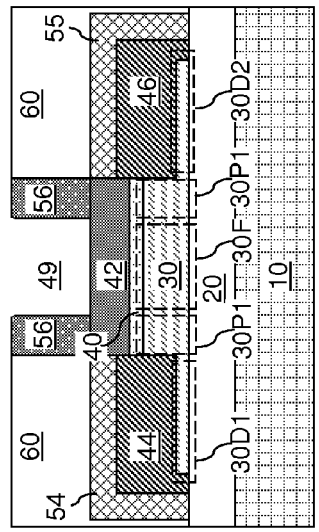
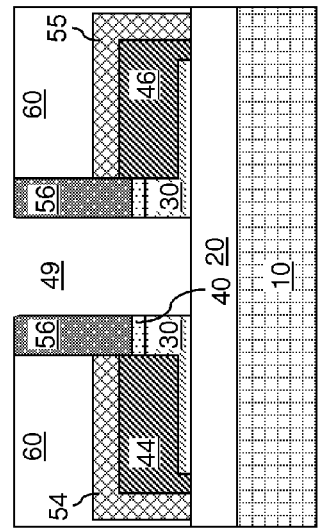
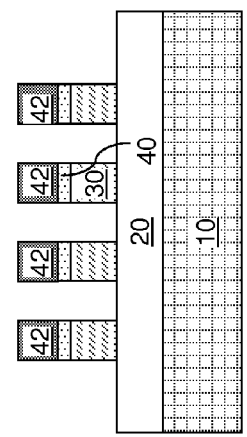
FIG. 11A
FIG. 11B
FIG. 11C
FIG. 11D

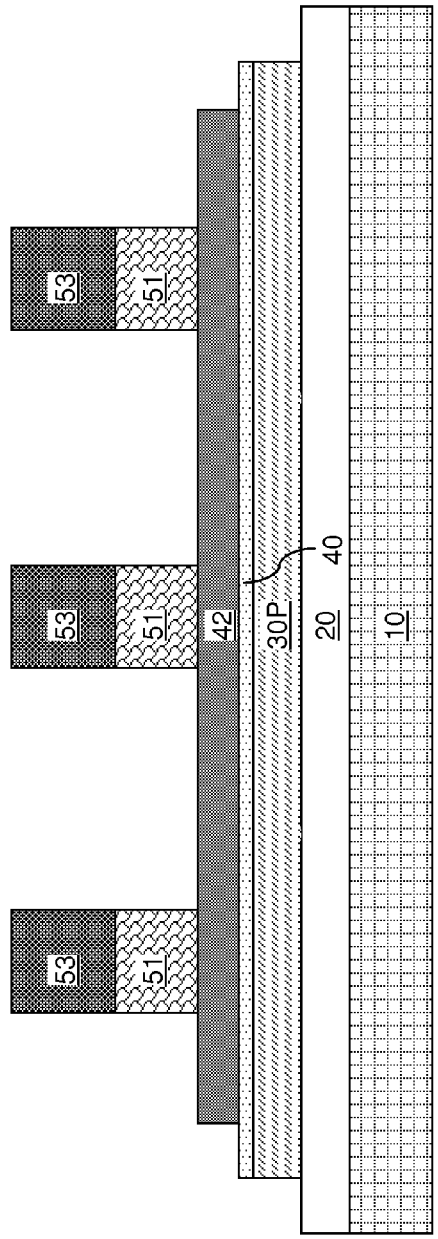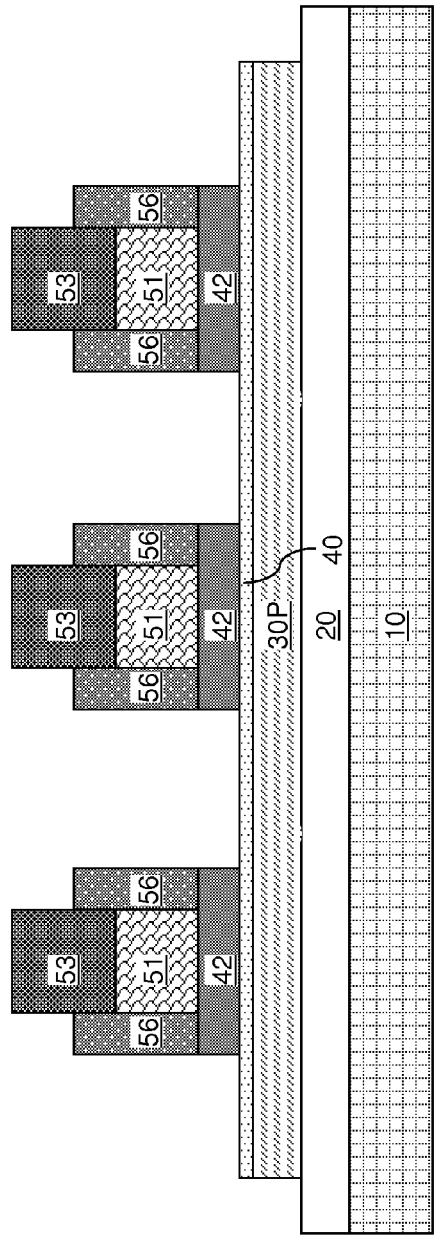

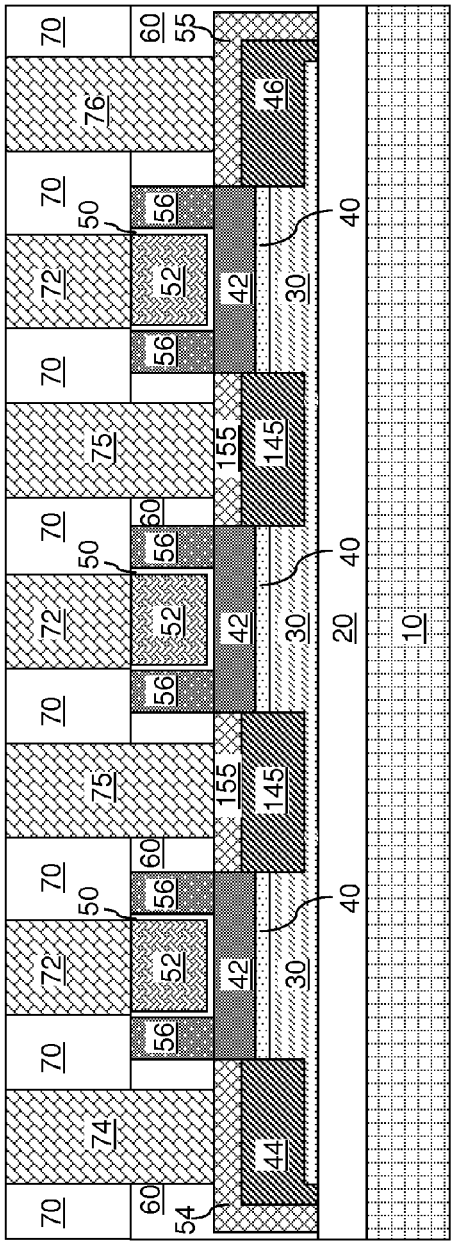
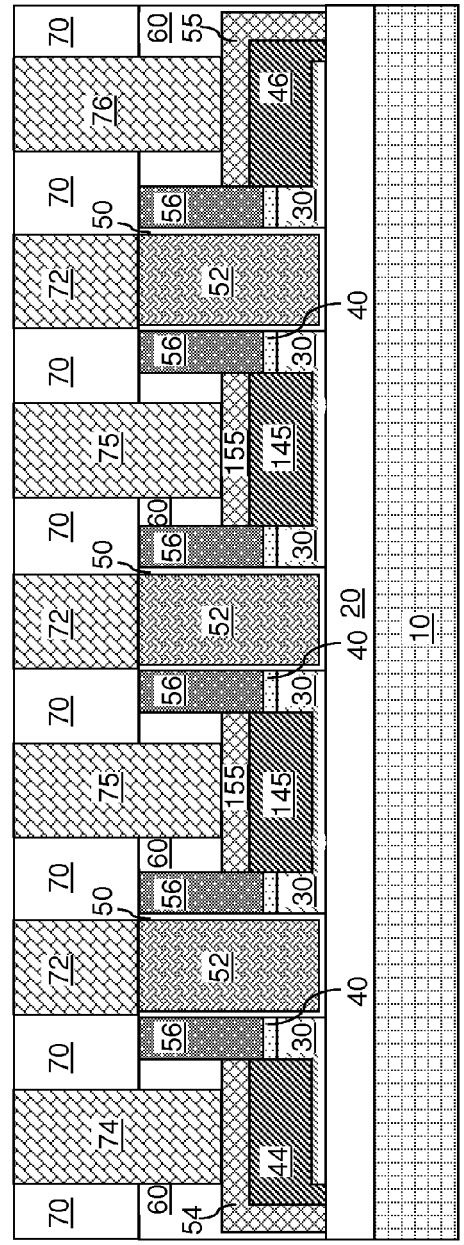
FIG. 18A
FIG. 18B

EMBEDDED PLANAR SOURCE/DRAIN STRESSORS FOR A FINFET INCLUDING A PLURALITY OF FINS

BACKGROUND

The present disclosure relates to a semiconductor structure, and particularly to a finFET transistor including embedded planar source/drain stressors and a method of manufacturing the same.

Various attempts have been made to introduce stress to the channel of a fin field effect transistor (finFET) without much success. For example, wrapping a stressor material on both ends of a rectangular parallelepiped shaped semiconductor fin of a finFET has not been successful in providing a stress to the channel because the stress is applied to the source region or to the drain region within the wrapped semiconductor material along the direction perpendicular to the direction of the channel. While merging of multiple source regions or multiple drain regions of a plurality of parallel semiconductor fins with selective epitaxy is also known, raised source/drain regions formed by epitaxial merging of multiple source/drain regions are structurally non-uniform and not fully single crystalline, providing complications and process variations during further processing due to the non-uniformity and seams between multiple single crystalline portions.

BRIEF SUMMARY

Fin-defining mask structures are formed over a semiconductor material layer having a first semiconductor material and a disposable gate structure is formed thereupon. A gate spacer is formed around the disposable gate structure and physically exposed portions of the fin-defining mask structures are subsequently removed. The semiconductor material layer is recessed employing the disposable gate structure and the gate spacer as an etch mask to form recessed semiconductor material portions. Embedded planar source/drain stressors are formed on the recessed semiconductor material portions by selective deposition of a second semiconductor material having a different lattice constant than the first semiconductor material. After formation of a planarization dielectric layer, the disposable gate structure is removed. A plurality of semiconductor fins are formed employing the fin-defining mask structures as an etch mask. A replacement gate structure is formed on the plurality of semiconductor fins.

According to an aspect of the present disclosure, a semiconductor structure includes a fin-containing semiconductor portion. The fin-containing semiconductor portion includes a first semiconductor material and including a plurality of semiconductor fins, a first end portion, and a second end portion. Each semiconductor fin among the plurality of semiconductor fins is laterally spaced from each other or one another along a widthwise direction. A lengthwise end of each of the plurality of semiconductor fins is adjoined to the first end portion and another lengthwise end of each of the plurality of semiconductor fins is adjoined to the second end portion. Each of the first end portion and the second end portion includes a proximal portion having a same height as the plurality of semiconductor fins and a distal portion having a lesser height than the plurality of semiconductor fins. The semiconductor structure further includes a first stress-generating semiconductor portion, which is in contact with a sidewall of the proximal portion of the first end portion and includes a second semiconductor material having a different lattice constant than the first semiconductor material and epitaxially aligned to the first end portion. Yet further, the semiconductor structure includes a second stress-generating semiconductor portion in contact with a sidewall of the proximal portion of the second end portion. The second stress-generating semiconductor portion includes the second semiconductor material and is epitaxially aligned to the second end portion.

In one embodiment, a plurality of fin-defining mask structures overlies the plurality of semiconductor fins, and the plurality of semiconductor fins has a same width as the plurality of fin-defining mask structures.

According to yet another aspect of the present disclosure, a method of forming a semiconductor structure is provided. A plurality of fin-defining mask structures is formed over a semiconductor material layer including a first semiconductor material. A disposable gate structure and a gate spacer are formed over middle portions of the plurality of fin-defining mask structures. Portions of the semiconductor material layer that are not covered by the disposable gate structure or by the gate spacer are recessed. A first stress-generating semiconductor portion and a second stress-generating semiconductor portion are formed, which include a second semiconductor material that is different from the first semiconductor material on the recessed portions of the semiconductor material layer. The disposable gate structure is removed to form a gate cavity. A plurality of semiconductor fins is formed by transferring a pattern of the plurality of fin-defining mask structures within the gate cavity into the remaining portion of the semiconductor material layer.

BRIEF DESCRIPTION OF SEVERAL VIEWS OF THE DRAWINGS

FIG. 2A is a top-down view of the first exemplary semiconductor structure after patterning of a semiconductor material layer according to an embodiment of the present disclosure.

FIG. 2B is a vertical cross-sectional view of the first exemplary semiconductor structure along the vertical plane B-B' of FIG. 2A.

FIG. 2C is a vertical cross-sectional view of the first exemplary semiconductor structure along the vertical plane C-C' of FIG. 2A.

FIG. 2D is a vertical cross-sectional view of the first exemplary semiconductor structure along the vertical plane D-D' of FIG. 2A.

FIG. 3A is a top-down view of the first exemplary semiconductor structure after formation of a disposable gate structure and a disposable gate cap according to an embodiment of the present disclosure.

FIG. 3B is a vertical cross-sectional view of the first exemplary semiconductor structure along the vertical plane B-B' of FIG. 3A.

FIG. 3C is a vertical cross-sectional view of the first exemplary semiconductor structure along the vertical plane C-C' of FIG. 3A.

FIG. 3D is a vertical cross-sectional view of the first exemplary semiconductor structure along the vertical plane D-D' of FIG. 3A.

FIG. 11A is a top-down view of the first exemplary semiconductor structure after formation of a plurality of semiconductor fins by transfer of the pattern of the plurality of fin-defining mask structures into the patterned semiconductor material layer according to an embodiment of the present disclosure.

FIG. 11B is a vertical cross-sectional view of the first exemplary semiconductor structure along the vertical plane B-B' of FIG. 11A.

FIG. 11C is a vertical cross-sectional view of the first exemplary semiconductor structure along the vertical plane C-C' of FIG. 11A.

FIG. 11D is a vertical cross-sectional view of the first exemplary semiconductor structure along the vertical plane D-D' of FIG. 11A.

FIG. 14 is a vertical cross-sectional view of a second exemplary semiconductor structure after formation of a plurality of disposable gate structures and disposable gate caps according to an embodiment of the present disclosure.

FIG. 15 is a vertical cross-sectional view of the second exemplary semiconductor structure after formation of a plurality of gate spacers and removal of portions of the plurality of fin-defining mask structures that are not covered by the disposable gate structures or by the gate spacers according to an embodiment of the present disclosure.

FIG. 18A is a first vertical cross-sectional view of the second exemplary semiconductor structure after formation of various contact via structures along a vertical plane that is equivalent to the vertical plane B-B' of FIG. 13A according to an embodiment of the present disclosure.

FIG. 18B is a second vertical cross-sectional view of the second exemplary semiconductor structure after formation of various contact via structures along a vertical plane that is equivalent to the vertical plane C-C' of FIG. 13A according to an embodiment of the present disclosure.

DETAILED DESCRIPTION

Figure 1B:
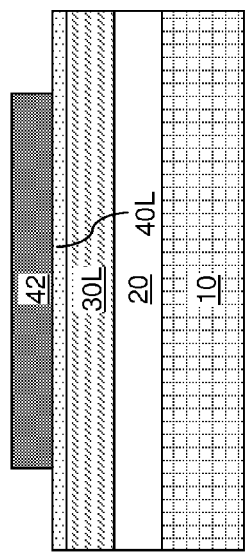
FIG. 1B is a vertical cross-sectional view of the first exemplary semiconductor structure along the vertical plane B-B' of FIG. 1A.
Figure 1C:
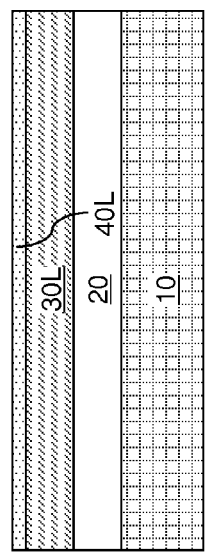
FIG. 1C is a vertical cross-sectional view of the first exemplary semiconductor structure along the vertical plane C-C' of FIG. 1A.
Figure 1A:
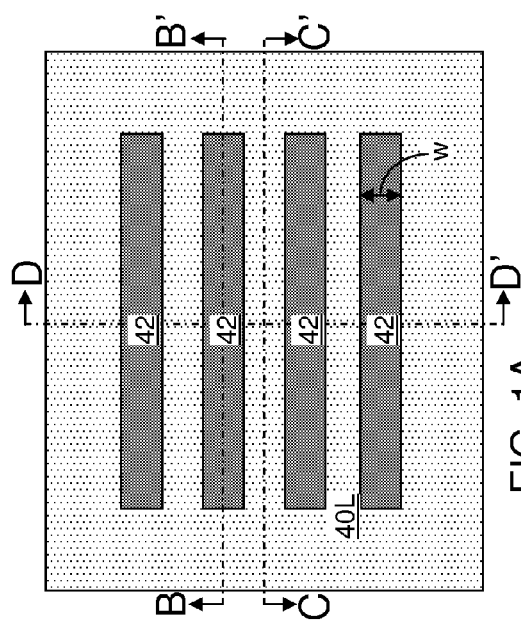
FIG. 1A is a top-down view of a first exemplary semiconductor structure after formation of an optional dielectric cap layer and a plurality of fin-defining mask structures according to an embodiment of the present disclosure.
Figure 1D:
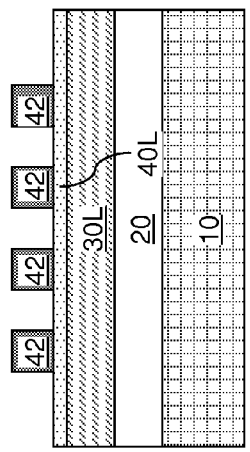
FIG. 1D is a vertical cross-sectional view of the first exemplary semiconductor structure along the vertical plane D-D' of FIG. 1A.
Figure 4B:
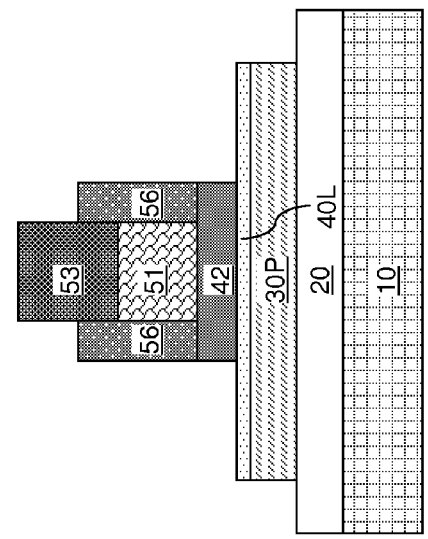
FIG. 4B is a vertical cross-sectional view of the first exemplary semiconductor structure along the vertical plane B-B' of FIG. 4A.
Figure 4C:
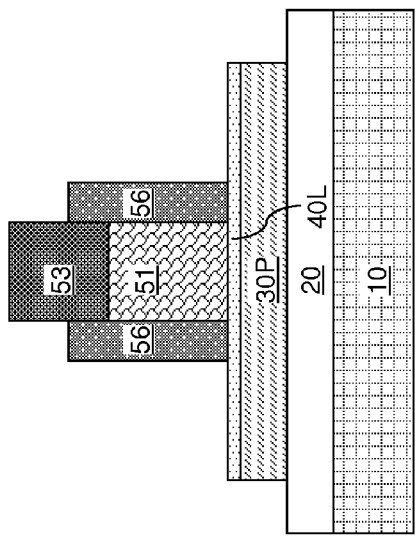
FIG. 4C is a vertical cross-sectional view of the first exemplary semiconductor structure along the vertical plane C-C' of FIG. 4A.
Figure 4A:
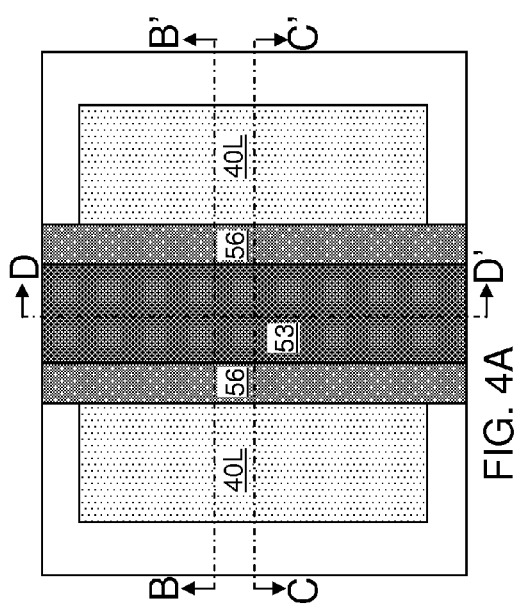
FIG. 4A is a top-down view of the first exemplary semiconductor structure after formation of a gate spacer and removal of portions of the plurality of fin-defining mask structures that are not covered by the disposable gate structure or by the gate spacer according to an embodiment of the present disclosure.
Figure 4D:
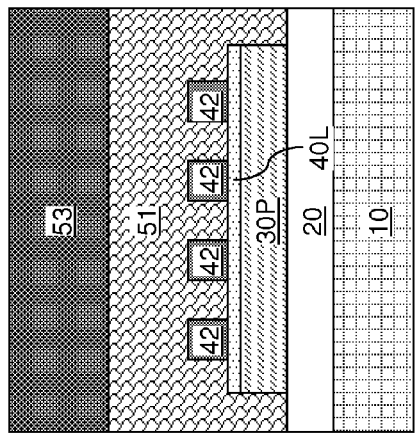
FIG. 4D is a vertical cross-sectional view of the first exemplary semiconductor structure along the vertical plane D-D' of FIG. 4A.

As stated above, the present disclosure relates to a finFET transistor including embedded planar source/drain stressors and a method of manufacturing the same. Aspects of the present disclosure are now described in detail with accompanying figures. It is noted that like reference numerals refer to like elements across different embodiments. The drawings are not necessarily drawn to scale.

Referring to FIGS. 1A, 1B, 1C, and 1D, a first exemplary semiconductor structure according to an embodiment of the present disclosure includes a semiconductor-on-insulator (SOI) substrate. The SOI substrate can include a stack, from bottom to top, of a handle substrate 10, a buried insulator layer 20, and a top semiconductor layer 30L.

The handle substrate 10 can include a semiconductor material, a conductive material, and/or a dielectric material. The handle substrate 10 provides mechanical support to the buried insulator layer 20 and the top semiconductor layer 30L. The thickness of the handle substrate 10 can be from 30 microns to 2 mm, although lesser and greater thicknesses can also be employed.

The buried insulator layer 20 includes a dielectric material such as silicon oxide, silicon nitride, silicon oxynitride, or a combination thereof. The thickness of the buried insulator layer 20 can be from 50 nm to 5 microns, although lesser and greater thicknesses can also be employed.

The top semiconductor layer 30L is a semiconductor material layer including a first semiconductor material. The first semiconductor material can be an elemental semiconductor material or a compound semiconductor material. For example, the first semiconductor material can be silicon, germanium, a silicon-germanium alloy, or a silicon-carbon alloy. The first semiconductor material may or may not be doped with p-type dopants and/or n-type dopants. The first semiconductor material can be a single crystalline semiconductor material, a polycrystalline semiconductor material, or an amorphous semiconductor material. In one embodiment, the first semiconductor material can be silicon. In one embodiment, the first semiconductor material can be single crystalline silicon. The thickness of the top semiconductor layer 30L can be from 10 nm to 500 nm, although lesser and greater thicknesses can also be employed.

An optional dielectric pad layer 40L can be formed on the top surface of the top semiconductor layer 30L. The optional dielectric pad layer 40L includes a dielectric material, which can be, for example, silicon oxide, silicon oxynitride, a dielectric metal oxide, or a combination thereof. The optional dielectric pad layer 40L can be formed, for example, by chemical vapor deposition (CVD) or conversion of a topmost portion of the top semiconductor layer 30L by thermal oxidation, thermal nitridation, plasma oxidation, plasma nitridation, or a combination thereof. The thickness of the optional dielectric pad layer 40L can be from 1 nm to 20 nm, although lesser and greater thicknesses can also be employed.

A plurality of fin-defining mask structures 42 can be formed over the top semiconductor layer 30L. The plurality of fin-defining mask structures 42 can be formed directly on the optional dielectric pad layer 40L, if present. The plurality of fin-defining mask structures 42 are mask structures that cover the regions of the top semiconductor layer 30L that are subsequently converted into semiconductor fins. Thus, the plurality of fin-defining mask structures 42 are subsequently employed to define the area of the semiconductor fins. The plurality of fin-defining mask structures 42 can include a dielectric material such as silicon nitride, silicon oxide, and silicon oxynitride.

The plurality of fin-defining mask structures 42 can be formed, for example, by depositing a planar dielectric material layer and lithographically patterning the dielectric material layer. The planar dielectric material layer can be deposited, for example, by chemical vapor deposition (CVD). The thickness of the planar dielectric material layer can be from 5 nm to 100 nm, although lesser and greater thicknesses can also be employed.

The planar dielectric material layer can be subsequently patterned to form the plurality of fin-defining mask structures 42. In on embodiment, each fin-defining mask structure 42 in the plurality of fin-defining mask structures 42 can laterally extend along a lengthwise direction (e.g., the horizontal direction within the B-B' plane or the C-C' plane). Further, each fin-defining mask structure 42 in the plurality of fin-defining mask structures 42 can have a pair of sidewalls that are separated along a widthwise direction, which is perpendicular to the lengthwise direction. In one embodiment, each fin-defining mask structure 42 in the plurality of fin-defining mask structures 42 can have a rectangular horizontal cross-sectional area. In one embodiment, the fin-defining mask structures 42 in the plurality of fin-defining mask structures 42 can have the same width w.

Referring to FIGS. 2A, 2B, 2C, and 2D, a photoresist layer 37 can be applied over the plurality of fin-defining mask structures 42. The photoresist layer 37 can subsequently patterned to cover an area overlying a portion or the entirety of the plurality of fin-defining mask structures 42.

Any portions of the fin-defining mask structures which lie outside the photoresist layer 37 may be removed, and the pattern in the photoresist layer 37 is transferred into the optional dielectric pad layer 40L and the top semiconductor layer 30L by an etch. The etch can be an anisotropic etch or an isotropic etch. In one embodiment, the etch can be a reactive ion etch, which is an anisotropic etch. In one embodiment, the etch can be selective to the dielectric material of the buried insulator layer 20. A remaining portion of the top semiconductor layer 30L after the pattern transfer from the photoresist layer 37 through the top semiconductor layer 30L is herein referred to as a patterned semiconductor material layer 30P.

Referring to FIGS. 3A, 3B, 3C, and 3D, a disposable gate structure 51 and a disposable gate cap 53 can be formed. The disposable gate structure 51 and the disposable gate cap 53 can be formed, for example, by depositing a disposable gate material layer (not shown) and a disposable gate cap layer (not shown), and subsequently lithographically patterning the disposable gate material layer and the disposable gate cap layer. A remaining portion of the disposable gate material layer after the lithographic patterning constitutes the disposable gate structure 51, and a remaining portion of the disposable gate cap layer after the lithographic patterning constitutes the disposable gate cap 53.

The disposable gate material layer includes a material that can be removed selective to the material of the plurality of fin-defining mask structures 42 and selective to material of the optional dielectric pad layer 40L if the optional dielectric pad layer 40L is present. In this case, the disposable gate material layer can include a semiconductor material, a dielectric material that is different from the dielectric material of the optional dielectric cap pad layer 40L, or a metallic material. Exemplary semiconductor materials that can be employed for the disposable gate material layer include silicon, germanium, a silicon germanium alloy, a silicon carbon alloy, a compound semiconductor material, or a combination thereof. The disposable gate material layer can be deposited, for example, by chemical vapor deposition (CVD). The thickness of the disposable gate material layer, as measured above a planar surface, can be from 50 nm to 600 nm, although lesser and greater thicknesses can also be employed.

The disposable gate material layer includes a material that can be removed selective to the material of the plurality of fin-defining mask structures 42 and selective to the material of the patterned semiconductor material layer 30P if the optional dielectric pad layer 40L is not present. In this case, the disposable gate material layer can include a semiconductor material that is different from the first semiconductor material (i.e., the semiconductor material of the patterned semiconductor material layer 30P), a dielectric material, or a metallic material. Exemplary semiconductor materials that can be employed for the disposable gate material layer include silicon, germanium, a silicon germanium alloy, a silicon carbon alloy, a compound semiconductor material, or a combination thereof. The disposable gate material layer can be deposited, for example, by chemical vapor deposition (CVD). The thickness of the disposable gate material layer, as measured above a planar surface, can be from 50 nm to 600 nm, although lesser and greater thicknesses can also be employed. In one embodiment, the first semiconductor material can be silicon, and the material of the disposable gate material layer can be germanium, a silicon germanium alloy, undoped silicon oxide, doped silicon oxide, or a combination thereof.

The disposable gate cap layer includes a material that can be employed as an etch mask for subsequently etching the patterned semiconductor material layer 30P. For example, the disposable gate cap layer can include silicon nitride, silicon oxide, silicon oxynitride, or a combination thereof. The thickness of the disposable gate cap layer can be from 20 nm to 300 nm, although lesser and greater thicknesses can also be employed. In one embodiment, the disposable gate cap layer can include the same material as the material of the plurality of fin-defining mask structures 42. In this case, the thickness of the disposable gate cap layer can be greater than the height (thickness) of the plurality of fin-defining mask structures 42. In one embodiment, the plurality of fin-defining mask structures 42 and the disposable gate cap layer can include silicon nitride.

A photoresist layer (not shown) can be applied over the stack, from bottom to top, of the disposable gate material layer and the disposable gate cap layer. The photoresist layer can be subsequently patterned into gate patterns, which are typically a plurality of lines which run perpendicular to and intersect the plurality of fin-defining mask structures 42. Physically exposed portions of the disposable gate material layer and the disposable gate cap layer, i.e., portions of the disposable gate material layer and the disposable gate cap layer that are not covered by the patterned photoresist layer, are removed, for example, by an etch, which can be an anisotropic etch. The etch that removes physically exposed portions of the disposable gate material layer and the disposable gate cap layer can be selective to the materials of the plurality of fin-defining mask structures 42. If the optional dielectric pad layer 40L is present, the etch that removes physically exposed portions of the disposable gate material layer and the disposable gate cap layer can be selective to the materials of the optional dielectric pad layer 40. If the optional dielectric pad layer 40L is not present, the etch that removes physically exposed portions of the disposable gate material layer and the disposable gate cap layer can be selective to the first semiconductor material of the patterned semiconductor material layer 30P. The stack of the disposable gate structure 51 and the disposable gate cap 53 straddles over middle portions of the plurality of fin-defining mask structures 42.

In one embodiment, the portions of the patterned semiconductor material layer 30P that do not underlie the stack of the disposable gate structure 51 and the disposable gate cap 53 can be doped with dopants to form a source region (not shown) and a drain region (not shown).

Referring to FIGS. 4A, 4B, 4C, and 4D, a gate spacer 56 can be formed on sidewalls of the stack of the disposable gate structure 51 and the disposable gate cap 53. A conformal dielectric material layer (not shown) can be deposited on the stack of the disposable gate structure 51 and the disposable gate cap 53 and over the plurality of fin-defining mask structures 42, for example, by chemical vapor deposition (CVD) or atomic layer deposition (ALD). The conformal dielectric material layer includes a dielectric material such as silicon nitride, silicon oxide, a dielectric metal oxide, or a combination thereof. The thickness of the conformal dielectric material layer can be from 3 nm to 100 nm, although lesser and greater thicknesses can also be employed.

The dielectric material of the conformal dielectric material layer may, or may not be, the same as the dielectric material of the plurality of fin-defining mask structures 42. In one embodiment, the dielectric material of the conformal dielectric material layer can be the same as the dielectric material of the plurality of fin-defining mask structures 42. In one embodiment, the dielectric material of the conformal dielectric material layer and the dielectric material of the plurality of fin-defining mask structures 42 can be silicon nitride.

Vertical portions of the conformal dielectric material layer are subsequently etched by an anisotropic etch to form the gate spacer 56. The anisotropic etch that forms the gate spacer 56 can be selective to the material of the optional dielectric pad layer 40L if the optional dielectric pad layer 40L is present. The anisotropic etch that forms the gate spacer 56 can be selective to the first semiconductor material of the patterned semiconductor material layer 30P if the optional dielectric pad layer 40L is not present.

Further, portions of the plurality of fin-defining mask structures 42 that are not covered by the disposable gate structure 51 or by vertical portions of the conformal dielectric material layer, i.e., the portions of the conformal dielectric material layer that become the gate spacer 56, are etched by a subsequent etch, which may employ the same etch chemistry as the etch that forms the gate spacer 56, or may employ a different etch chemistry. The subsequent etch can be selective to the material of the optional dielectric pad layer 40L if the optional dielectric pad layer 40L is present. The subsequent etch can be selective to the first semiconductor material of the patterned semiconductor material layer 30P if the optional dielectric pad layer 40L is not present. The subsequent etch can be an anisotropic etch, or can be an isotropic etch. Thus, portions of the plurality of fin-defining mask structures 42 that are not covered by the disposable gate structure 51 or by the gate spacer 56 are removed by the end of the subsequent etch.

Referring to FIGS. 5A, 5B, 5C, and 5D, portions of the optional dielectric pad layer 40L can be removed by an etch, which can be an anisotropic etch or an isotropic etch. The remaining portion of the optional dielectric pad layer 40L is herein referred to as an optional dielectric pad 40. The optional dielectric pad 40 underlies the plurality of fin-defining mask structures 42, the disposable gate structure 51, and the gate spacer 56.

Subsequently, portions of the patterned semiconductor material layer 30P that are not covered by the disposable gate structure 51 or by the gate spacer 56 are recessed. In one embodiment, an anisotropic etch may be used. The anisotropic etch may remove the first semiconductor material of the patterned semiconductor material layer 30P selective to the materials of the disposable gate cap 53 and the gate spacer 56. In another embodiment, a crystallographic etch may be used to create a sigma-shaped recess.

Each of the recessed portions of the patterned semiconductor material layer 30P includes a sidewall 30V that is aligned with a sidewall of the gate spacer 56. One of the two sidewalls 30V is herein referred to as a first sidewall, and the other of the two sidewalls 30V is herein referred to as a second vertical sidewall.

Further, each of the recessed portions of the patterned semiconductor material layer 30P has a bottom recessed surface 30S that is located below the horizontal plane of the topmost surface of the patterned semiconductor material layer 30P and above an interface between the patterned semiconductor material layer 30P and the buried insulator layer 20. In one embodiment, each bottom recessed surface 30S can overlie an entirety of one of the recessed portions of the patterned semiconductor material layer 30P.

Referring to FIGS. 6A, 6B, 6C, and 6D, a second semiconductor material can be deposited on semiconductor surfaces of the patterned semiconductor material layer 30P by a selective deposition method. The selective deposition method can be, for example, selective epitaxy. The second semiconductor material is different from the first semiconductor material. In one embodiment, the first semiconductor material of the patterned semiconductor material layer 30P can be single crystalline, and the second semiconductor material can be a material that can be epitaxially deposited on the single crystalline first semiconductor material to form epitaxial second semiconductor material portions.

In one embodiment, the second semiconductor material is lattice-mismatched with respect to the single crystalline first semiconductor material of the patterned semiconductor material layer 30P, i.e., have a different lattice constant than the lattice constant of the first semiconductor material. For example, the first semiconductor material can be silicon, and the second semiconductor material can be a silicon-germanium alloy or a silicon-carbon alloy.

During the selective deposition, the second semiconductor material is deposited on semiconductor surfaces, i.e., the physically exposed surfaces of the patterned semiconductor material layer 30P, while the second semiconductor material is not deposited on dielectric surfaces such as the surfaces of the disposable gate cap 53, the gate spacer 56, and the plurality of fin-defining mask structures 42.

The epitaxial second semiconductor material portions formed on the two recessed portions of the patterned semiconductor material layer 30P applies stress along a lengthwise direction of the patterned semiconductor material layer 30P. Thus, the epitaxial second semiconductor material portions are herein referred to as stress-generating semiconductor material portions (44, 46). The lengthwise direction of the patterned semiconductor material layer 30P is the horizontal direction connecting a center portion of a first recessed portion of the patterned semiconductor material layer 30P and a center portion of a second recessed portion of the patterned semiconductor material layer 30P. The lengthwise direction of the patterned semiconductor material layer 30P can be the same as the lengthwise direction of the plurality of fin-defining mask structures 42.

The stress-generating semiconductor material portions (44, 46) include a first stress-generating semiconductor material portion 44 that is formed on one of the two recessed portions of the patterned semiconductor material layer 30P. Further, the stress-generating semiconductor material portions (44, 46) include a second stress-generating semiconductor material portion 46 that is formed on the other of the two recessed portions of the patterned semiconductor material layer 30P. The first stress-generating semiconductor material portion 44 is formed by depositing the second semiconductor material in epitaxial alignment with one of the recessed portions of the patterned semiconductor material layer 30P selective to dielectric surfaces, and the second stress-generating semiconductor material portion 46 is formed by depositing the second semiconductor material in epitaxial alignment with the other of the recessed portions of the patterned semiconductor material layer 30P selective to the dielectric surfaces.

In one embodiment, the first stress-generating semiconductor portion 44 can be in contact with each of the plurality of fin-defining mask structures 42, and the second stress-generating semiconductor portion 46 can be in contact with each of the plurality of fin-defining mask structures 42. In one embodiment, the first stress-generating semiconductor portion 44 and the second stress-generating semiconductor portion 46 can be deposited at the same deposition rate, and the entire top surface of the first stress-generating semiconductor portion 44 and the entire top surface of the second stress-generating semiconductor portion 46 can be within the same horizontal plane.

Figure 5A:
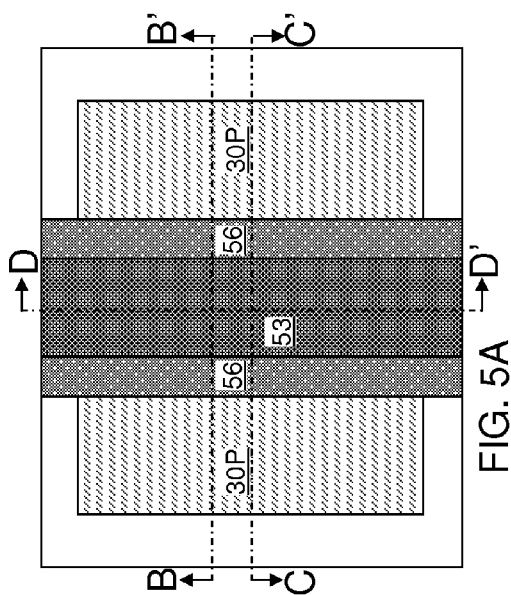
FIG. 5A is a top-down view of the first exemplary semiconductor structure after recessing portions of the patterned semiconductor material layer that are not covered by the disposable gate structure or by the gate spacer according to an embodiment of the present disclosure.
Figure 5B:
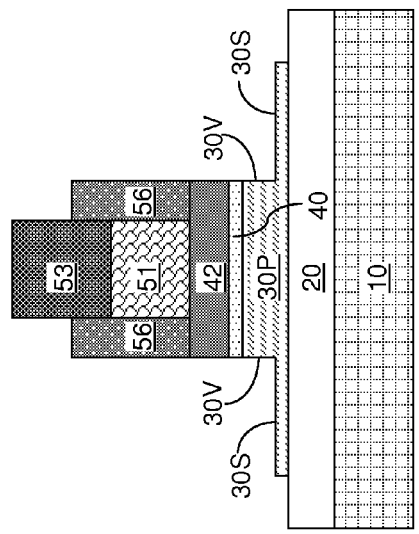
FIG. 5B is a vertical cross-sectional view of the first exemplary semiconductor structure along the vertical plane B-B' of FIG. 5A.
Figure 5C:
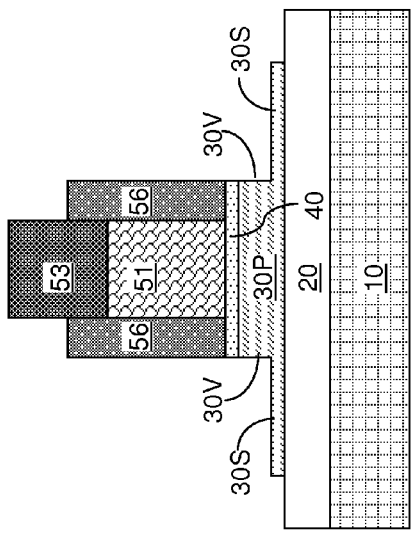
FIG. 5C is a vertical cross-sectional view of the first exemplary semiconductor structure along the vertical plane C-C' of FIG. 5A.
Figure 5D:
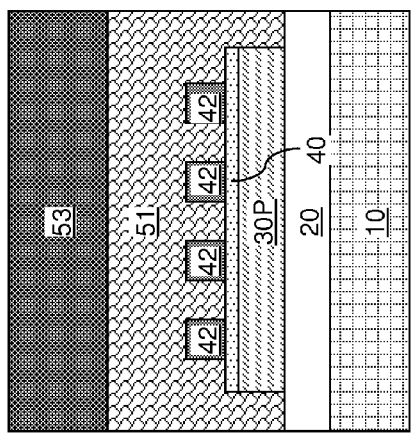
FIG. 5D is a vertical cross-sectional view of the first exemplary semiconductor structure along the vertical plane D-D' of FIG. 5A.
Figure 6A:
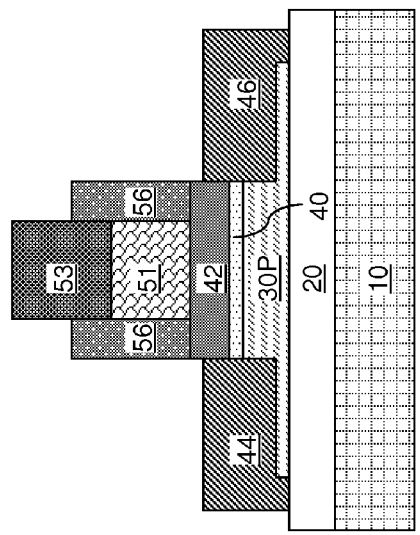
FIG. 6A is a top-down view of the first exemplary semiconductor structure after selective epitaxial growth of stress-generating semiconductor portions according to an embodiment of the present disclosure.
Figure 6B:
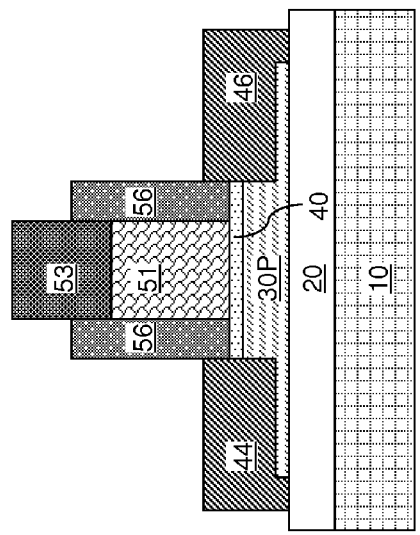
FIG. 6B is a vertical cross-sectional view of the first exemplary semiconductor structure along the vertical plane B-B' of FIG. 6A.
Figure 6D:
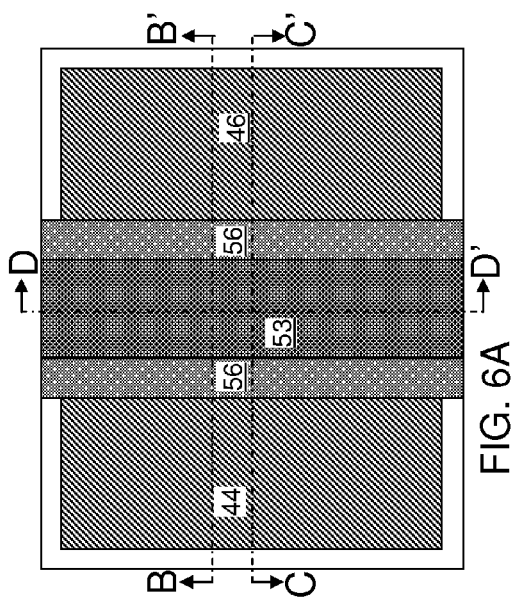
FIG. 6D is a vertical cross-sectional view of the first exemplary semiconductor structure along the vertical plane D-D' of FIG. 6A.
Figure 6C:
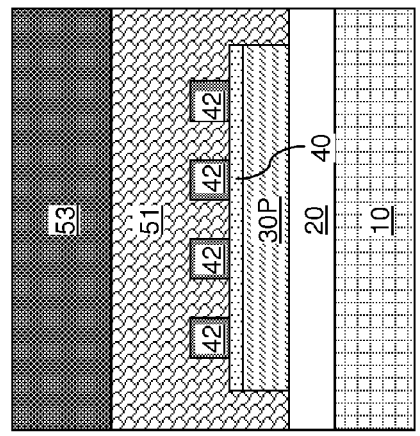
FIG. 6C is a vertical cross-sectional view of the first exemplary semiconductor structure along the vertical plane C-C' of FIG. 6A.
Figure 7B:
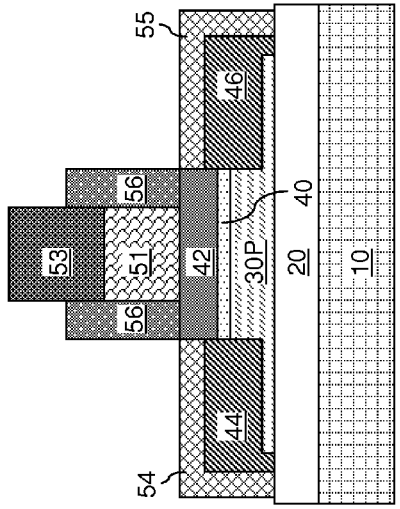
FIG. 7B is a vertical cross-sectional view of the first exemplary semiconductor structure along the vertical plane B-B' of FIG. 7A.
Figure 7C:
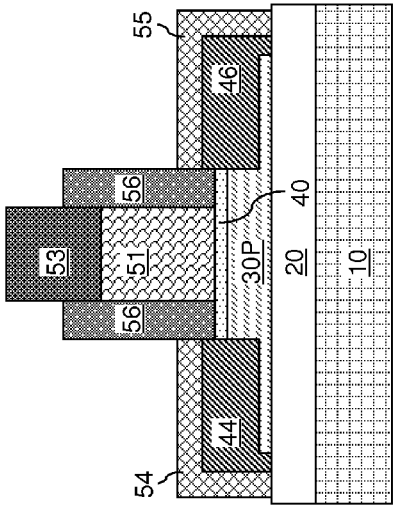
FIG. 7C is a vertical cross-sectional view of the first exemplary semiconductor structure along the vertical plane C-C' of FIG. 7A.
Figure 7A:
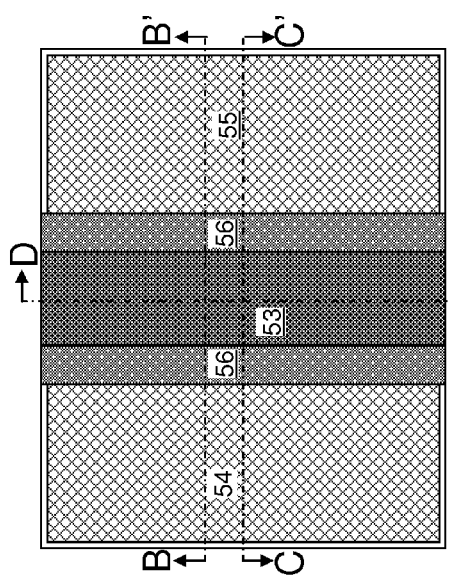
FIG. 7A is a top-down view of the first exemplary semiconductor structure after formation of metal semiconductor alloy portions according to an embodiment of the present disclosure.
Figure 7D:
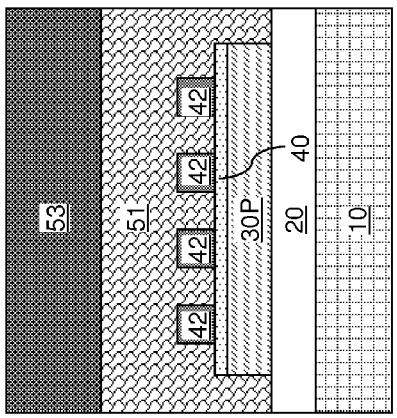
FIG. 7D is a vertical cross-sectional view of the first exemplary semiconductor structure along the vertical plane D-D' of FIG. 7A.
Figure 8B:
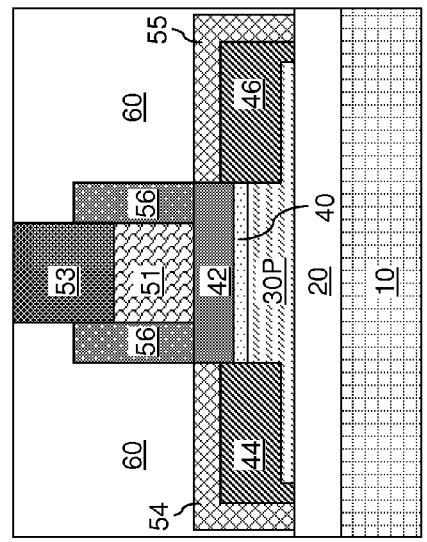
FIG. 8B is a vertical cross-sectional view of the first exemplary semiconductor structure along the vertical plane B-B' of FIG. 8A.
Figure 8C:
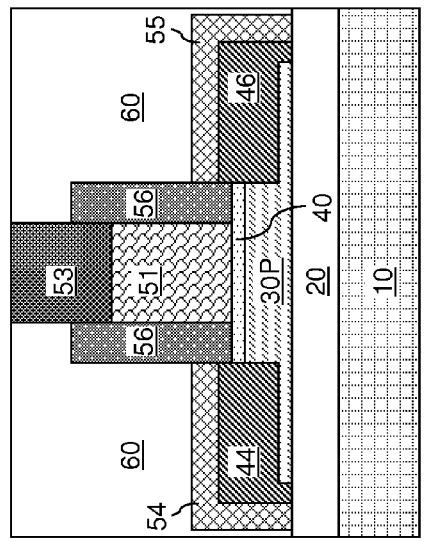
FIG. 8C is a vertical cross-sectional view of the first exemplary semiconductor structure along the vertical plane C-C' of FIG. 8A.
Figure 8A:
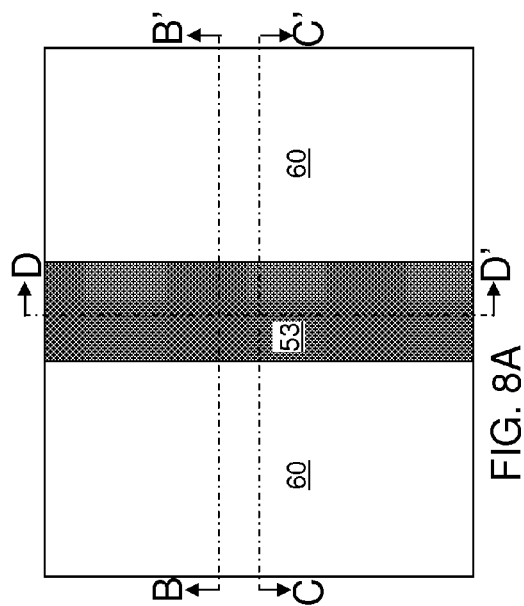
FIG. 8A is a top-down view of the first exemplary semiconductor structure after formation and planarization of a planarization dielectric layer according to an embodiment of the present disclosure.
Figure 8D:
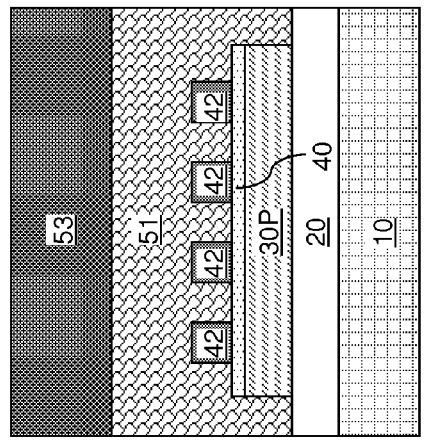
FIG. 8D is a vertical cross-sectional view of the first exemplary semiconductor structure along the vertical plane D-D' of FIG. 8A.
Figure 9A:
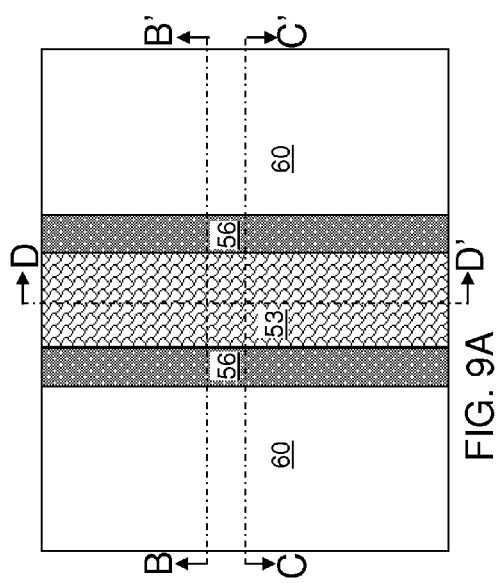
FIG. 9A is a top-down view of the first exemplary semiconductor structure after further planarization of the planarization dielectric layer and the disposable gate cap according to an embodiment of the present disclosure.
Figure 9B:
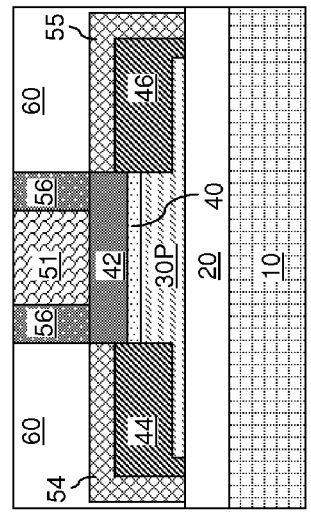
FIG. 9B is a vertical cross-sectional view of the first exemplary semiconductor structure along the vertical plane B-B' of FIG. 9A.
Figure 9C:
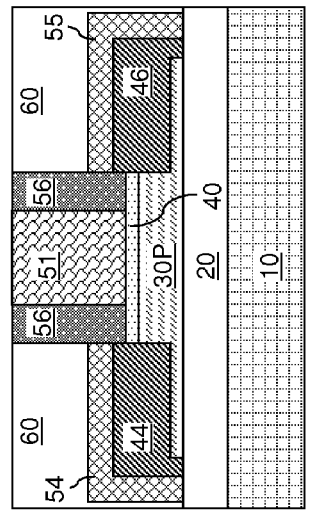
FIG. 9C is a vertical cross-sectional view of the first exemplary semiconductor structure along the vertical plane C-C' of FIG. 9A.
Figure 9D:
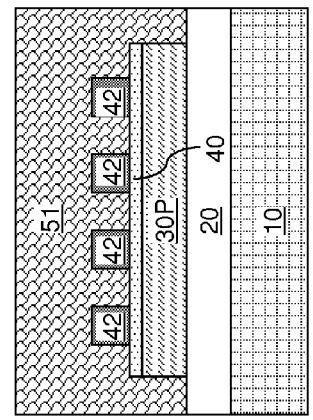
FIG. 9D is a vertical cross-sectional view of the first exemplary semiconductor structure along the vertical plane D-D' of FIG. 9A.
Figure 10B:
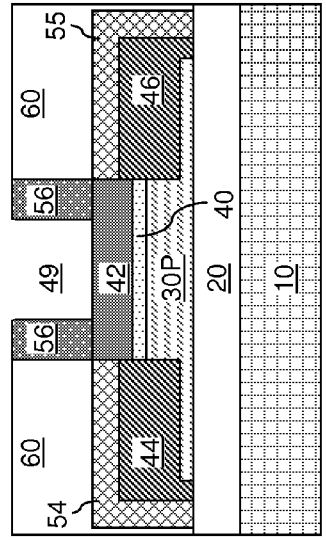
FIG. 10B is a vertical cross-sectional view of the first exemplary semiconductor structure along the vertical plane B-B' of FIG. 10A.
Figure 10C:
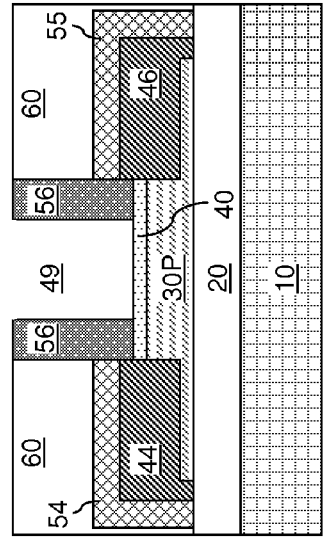
FIG. 10C is a vertical cross-sectional view of the first exemplary semiconductor structure along the vertical plane C-C' of FIG. 10A.
Figure 10A:
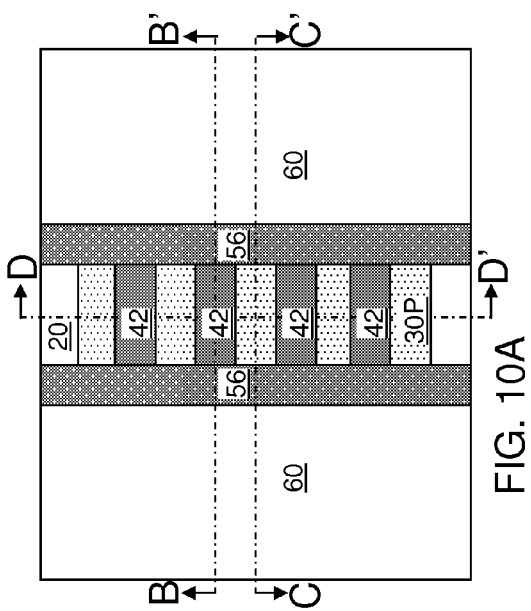
FIG. 10A is a top-down view of the first exemplary semiconductor structure after removal of the disposable gate structure according to an embodiment of the present disclosure.
Figure 10D:
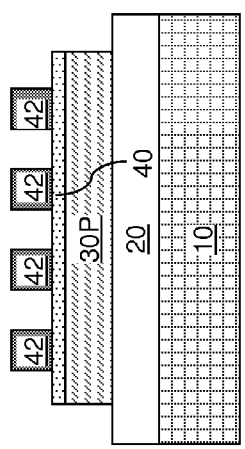
FIG. 10D is a vertical cross-sectional view of the first exemplary semiconductor structure along the vertical plane D-D' of FIG. 10A.
Figure 12B:
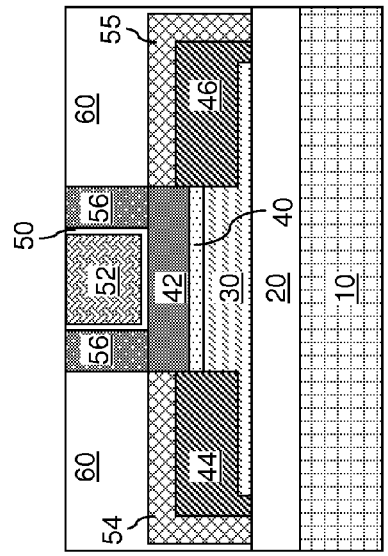
FIG. 12B is a vertical cross-sectional view of the first exemplary semiconductor structure along the vertical plane B-B' of FIG. 12A.
Figure 12C:
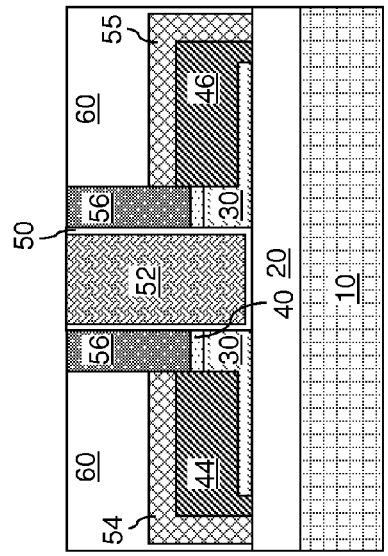
FIG. 12C is a vertical cross-sectional view of the first exemplary semiconductor structure along the vertical plane C-C' of FIG. 12A.
Figure 12A:
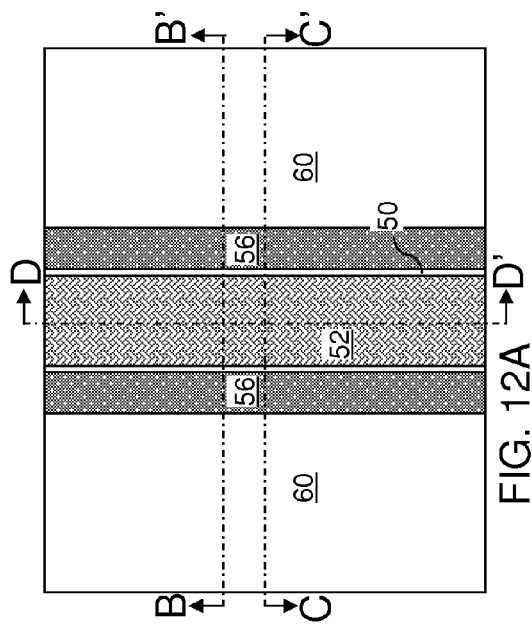
FIG. 12A is a top-down view of the first exemplary semiconductor structure after formation of a gate dielectric and a gate electrode according to an embodiment of the present disclosure.
Figure 12D:
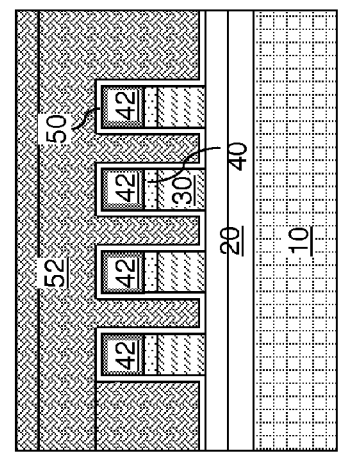
FIG. 12D is a vertical cross-sectional view of the first exemplary semiconductor structure along the vertical plane D-D' of FIG. 12A.
Figure 13B:
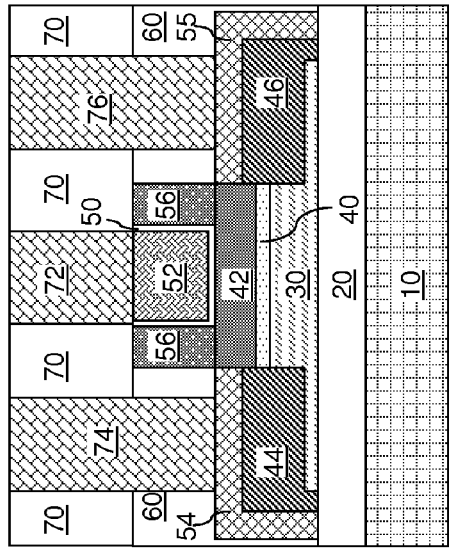
FIG. 13B is a vertical cross-sectional view of the first exemplary semiconductor structure along the vertical plane B-B' of FIG. 13A.
Figure 13C:
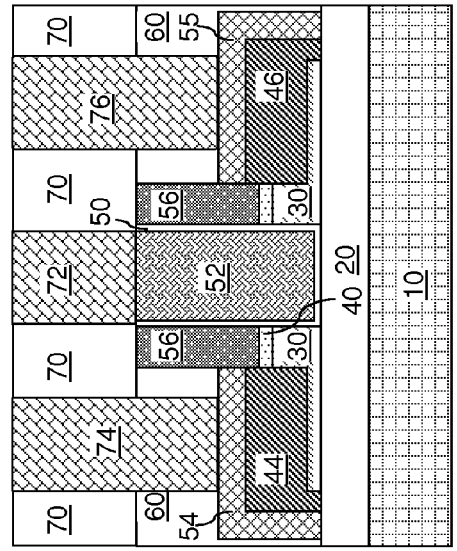
FIG. 13C is a vertical cross-sectional view of the first exemplary semiconductor structure along the vertical plane C-C' of FIG. 13A.
Figure 13A:
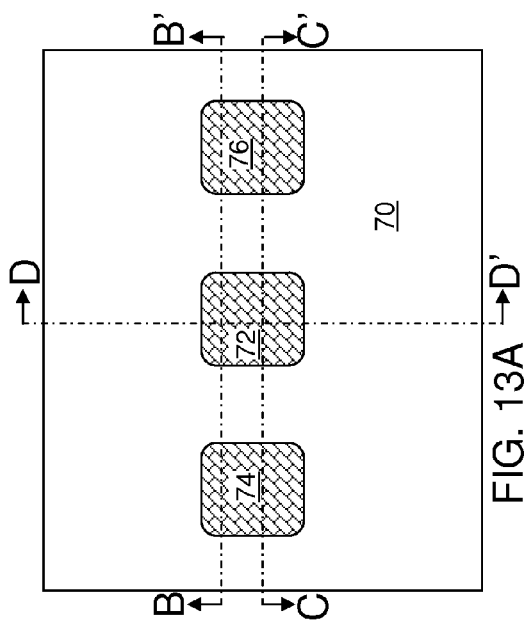
FIG. 13A is a top-down view of the first exemplary semiconductor structure after formation of various contact via structures according to an embodiment of the present disclosure.
Figure 13D:
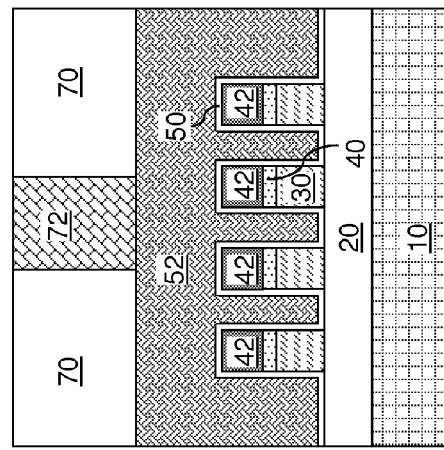
FIG. 13D is a vertical cross-sectional view of the first exemplary semiconductor structure along the vertical plane D-D' of FIG. 13A.

In one embodiment, the first stress-generating semiconductor portion 44 is formed directly on the entirety of the first vertical sidewall (i.e., one of the two vertical sidewalls 30V in FIGS. 5B and 5C), and the second stress-generating semiconductor portion 46 is formed directly on the entirety of the second vertical sidewall (i.e., another of the two vertical sidewalls 30V in FIGS. 5B and 5C).

The first stress-generating semiconductor portion 44 and the second stress-generating semiconductor portion 46 can be formed as doped semiconductor material portions by in-situ doping, or can be formed as intrinsic semiconductor material portions and subsequently doped with p-type dopants or n-type dopants by ion implantation or plasma doping. The conductivity type of the first stress-generating semiconductor portion 44 and the second stress-generating semiconductor portion 46 can be the same as the conductivity type of the source region and the drain region, which can be formed at the processing step illustrated in FIGS. 3A-3D. In one embodiment, the first semiconductor material can be silicon, and the second semiconductor material can be selected from undoped germanium, p-doped germanium, n-doped germanium, an undoped silicon germanium alloy, a p-doped silicon germanium alloy, an n-doped silicon germanium alloy, an undoped silicon carbon alloy, a p-doped silicon carbon alloy, and an n-doped silicon carbon alloy.

One of the first and second stress-generating semiconductor portions (44, 46) contacts a source region (not shown) and functions as an extended source region, and the other of the first and second stress-generating semiconductor portions (44, 46) contacts a drain region (not shown) and functions as an extended drain region.

Referring to FIGS. 7A, 7B, 7C, and 7D, various metal semiconductor alloy portions (54, 55) can be formed on the physically exposed semiconductor surfaces of the first stress-generating semiconductor portion 44 and the second stress-generating semiconductor portion 46. For example, the various metal semiconductor alloy portions (54, 55) can be formed by depositing a metal layer by physical vapor deposition (PVD) or chemical vapor deposition (CVD), and by reacting the metal layer with the underlying second semiconductor material at an elevated temperature, and subsequently removing unreacted portions of the metal layer. The various metal semiconductor alloy portions (54, 55) can include a first metal semiconductor alloy portion 54 that is formed on the first stress-generating semiconductor portion 44, and a second metal semiconductor alloy portion 55 that is formed on the second stress-generating semiconductor portion 46. If the first and second metal semiconductor alloy portions (54, 55) include silicon or a silicon-containing alloy, the first and second metal semiconductor alloy portions (54, 55).

Referring to FIGS. 8A, 8B, 8C, and 8D, a planarization dielectric layer 60 can be deposited over the disposable gate cap 53, the gate spacer 56, and the various metal semiconductor alloy portions (54, 55). The planarization dielectric layer 60 includes at least one dielectric material, which can be silicon oxide, silicon nitride, silicon oxynitride, organosilicate glass (OSG), or a combination thereof. The thickness of the planarization dielectric layer 60 can be selected so that the entirety of the top surface of the planarization dielectric layer 60 is formed above the top surface of the disposable gate cap 53.

The planarization dielectric layer 60 can be subsequently planarized, for example, by chemical mechanical planarization (CMP) and/or a recess etch. In one embodiment, the disposable gate cap 53 can be employed as a stopping layer.

Referring to FIGS. 9A, 9B, 9C, and 9D, additional portions of the planarization dielectric layer 60 and the disposable gate cap 53 can be removed by an additional planarization process, which can be performed by additional CMP and/or an additional recess etch. In one embodiment, the disposable gate structure 51 can be employed as a stopping layer. A top surface of the disposable gate structure 51 is physically exposed. The top surface of the planarization dielectric layer 60 can be a planar surface.

Referring to FIGS. 10A, 10B, 10C, and 10D, the disposable gate structure 51 can be removed selective to the plurality of fin-defining mask structures 42. If the optional dielectric pad 40 is present, the disposable gate structure 51 can be removed selective to material of the optional dielectric pad 40. If the optional dielectric pad 40 is not present, the disposable gate structure 51 can be removed selective to the first semiconductor material of the plurality of fin-defining mask structures 42. A gate cavity 49 is formed within a volume from which the disposable gate structure 51 is removed.

Referring to FIGS. 11A, 11B, 11C, and 11D, a plurality of semiconductor fins 30F can be formed by transfer of the pattern of the plurality of fin-defining mask structures 42 underneath the gate cavity 49 into the patterned semiconductor material layer 30P. The area of the plurality of semiconductor fins 30F is the intersection of the area of the plurality of fin-defining mask structures 42 and the area of the gate cavity 49 (which is the same as the area of the disposable gate structure 51).

The remaining portion of the patterned semiconductor material layer 30P constitutes a fin-containing semiconductor portion 30. The fin-containing semiconductor portion 30 includes the first semiconductor material. The fin-containing semiconductor portion 30 can include a plurality of semiconductor fins 30F, a first end portion (30P1, 30D1), and a second end portion (30P2, 30D2). Each semiconductor fin 30F among the plurality of semiconductor fins 30F is laterally spaced from each other or one another along a widthwise direction, which is perpendicular to the lengthwise direction of the plurality of semiconductor fins 30F. The lengthwise direction of the plurality of semiconductor fins 30F is the same as the lengthwise direction of the plurality of fin-defining mask structures 42.

In one embodiment, the first end portion (30P1, 30D1) is a source region, and the second end portion (30P2, 30D2) is a drain region. In this case, the first stress-generating semiconductor portion 44 functions as an extended source region, and the second stress-generating semiconductor portion 46 functions as an extended drain region. In another embodiment, the first end portion (30P1, 30D1) is a drain region, and the second end portion (30P2, 30D2) is a source region. In this case, the first stress-generating semiconductor portion 44 functions as an extended drain region, and the second stress-generating semiconductor portion 46 functions as an extended source region.

A lengthwise end of each of the plurality of semiconductor fins 30F is adjoined to the first end portion (30P1, 30D1), and another lengthwise end of each of the plurality of semiconductor fins 30F is adjoined to the second end portion (30P2, 30D2). The first end portion (30P1, 30D1) includes a first proximal portion 30P1 having the same height as the plurality of semiconductor fins 30F and a first distal portion 30D1 having a lesser height than the plurality of semiconductor fins 30F. The second end portion (30P2, 30D2) includes a second proximal portion 30P2 having the same height as the plurality of semiconductor fins 30F and a second distal portion 30D2 having a lesser height than the plurality of semiconductor fins 30F.

The first stress-generating semiconductor portion 44 is in contact with a vertical sidewall of the first proximal portion 30P1, which is the same as one of the two vertical sidewalls 30V (See FIGS. 5B and 5C). The first stress-generating semiconductor portion 44 includes the second semiconductor material, has a different lattice constant than the first semiconductor material, and is epitaxially aligned to the first semiconductor material of the first end portion (30P1, 30D1).

The second stress-generating semiconductor portion 46 is in contact with a vertical sidewall of the second proximal portion 30P2, which is the same as the other of the two vertical sidewalls 30V (See FIGS. 5B and 5C). The second stress-generating semiconductor portion 46 includes the second semiconductor material, has a different lattice constant than the first semiconductor material, and is epitaxially aligned to the first semiconductor material of the second end portion (30P2, 30D2).

The first stress-generating semiconductor portion 44 is in contact with the entirety of the top surface of the first distal portion 30D1 and a sidewall surface of the first end portion (30P1, 30D1) that adjoins the top surface of the buried insulator layer 20, i.e., a sidewall surface of the first distal portion 30D1 illustrated in FIGS. 11B and 11C. The second stress-generating semiconductor portion 46 is in contact with the entirety of the top surface of the second distal portion 30D2 and a sidewall surface of the second end portion (30P2, 30D2) that adjoins the top surface of the buried insulator layer 20, i.e., a sidewall surface of the second distal portion 30D2 illustrated in FIGS. 11B and 11C.

In one embodiment, a plurality of fin-defining mask structures 42 overlies the plurality of semiconductor fins 30F, and the plurality of semiconductor fins 30F has a same width as the plurality of fin-defining mask structures 42. Some regions of the first proximal portion 30P1 underlie end portions of the plurality of fin-defining mask structures 42, and some other regions of the first proximal portion 30P1 do not underlie the plurality of fin-defining mask structures 42. Likewise, some regions of the second proximal portion 30P2 underlie end portions of the plurality of fin-defining mask structures 42, and some other regions of the second proximal portion 30P2 do not underlie the plurality of fin-defining mask structures 42.

A first gate spacer portion of the gate spacer 56 contacts the first end portion (30P1, 30D1), and has the same thickness as the lateral extent of the first proximal portion 30P1 along the lengthwise direction of the plurality of semiconductor fins 30F. A second gate spacer portion of the gate spacer 56 contacts the second end portion (30P2, 30D2), and has the same thickness as the lateral extent of the second proximal portion 30P2 along the lengthwise direction of the plurality of semiconductor fins 30F.

In one embodiment, the bottom surface of the fin-containing semiconductor portion 30 laterally extends from a sidewall of the first distal portion 30P1 to a sidewall of the second distal portion 30P2, and the entirety of the bottom surface of the fin-containing semiconductor portion 30 is in contact with the planar top surface of the buried insulator layer 20.

Referring to FIGS. 12A, 12B, 12C, and 12D, a gate dielectric 50 and a gate electrode 52 can be formed within the gate cavity 49. The gate dielectric 50 can be formed directly on each lengthwise sidewall of the plurality of semiconductor fins 30F. The gate dielectric 50 can be formed as a single contiguous layer, for example, by deposition of a dielectric material by chemical vapor deposition (CVD) or atomic layer deposition (ALD), or can be formed by a set of non-contiguous material portions that are formed only on lengthwise sidewalls of the plurality of semiconductor fins 30F, for example, by conversion of surface portions of the first semiconductor material of the plurality of semiconductor fins 30F into a dielectric material such as silicon oxide, silicon nitride, or silicon oxynitride.

The gate electrode 52 can be formed by filling the gate trench with at least one conductive material such as at least one metallic material and/or at least one doped semiconductor material. The gate electrode 52 overlies the plurality of semiconductor fins 42, and is in contact with the gate dielectric 50. The portion of the at least one conductive material above the top surface of the planarization dielectric layer 60 can be removed, for example, by chemical mechanical planarization. The portion of the gate dielectric 50, if formed above the top surface of the planarization dielectric layer 60, may, or may not, be subsequently removed.

Referring to FIGS. 13A, 13B, 13C, and 13D, a contact level dielectric material layer 70 can be formed by depositing a dielectric material, which can include, for example, silicon oxide, silicon nitride, silicon oxynitride, and/or porous or non-porous organosilicate glass (OSG). Various contact via structures can be formed to provide electrical contact with various components of a fin field effect transistor, which includes a plurality of channels within the plurality of semiconductor fins 30F. The various contact via structures can include, for example, a gate contact via structure 72 that contacts the gate electrode 52, a first source/drain contact via structure 74 that contacts the first metal semiconductor alloy portion 54 or the first stress-generating semiconductor portion 44, and a second source/drain contact via structure 76 that contacts the second metal semiconductor alloy portion 55 or the second stress-generating semiconductor portion 46.

Referring to FIG. 14, a second exemplary semiconductor structure can be derived from the first exemplary structure of FIGS. 2A, 2B, 2C, and 2D by forming a plurality of disposable gate structures 51 and disposable gate caps 53 over the patterned semiconductor material layer 30P. The processing steps of FIGS. 3A, 3B, 3C, and 3D can be employed with modification of a pattern for patterning the disposable gate material layer (not shown) and the disposable gate cap layer (not shown).

Referring to FIG. 15, the processing steps of FIGS. 4A, 4B, 4C, and 4D are performed to form gate spacers 56 and to remove portions of the plurality of fin-defining mask structures 42 that are not covered by the disposable gate structures 51 or by the gate spacer 56.

Figure 16:
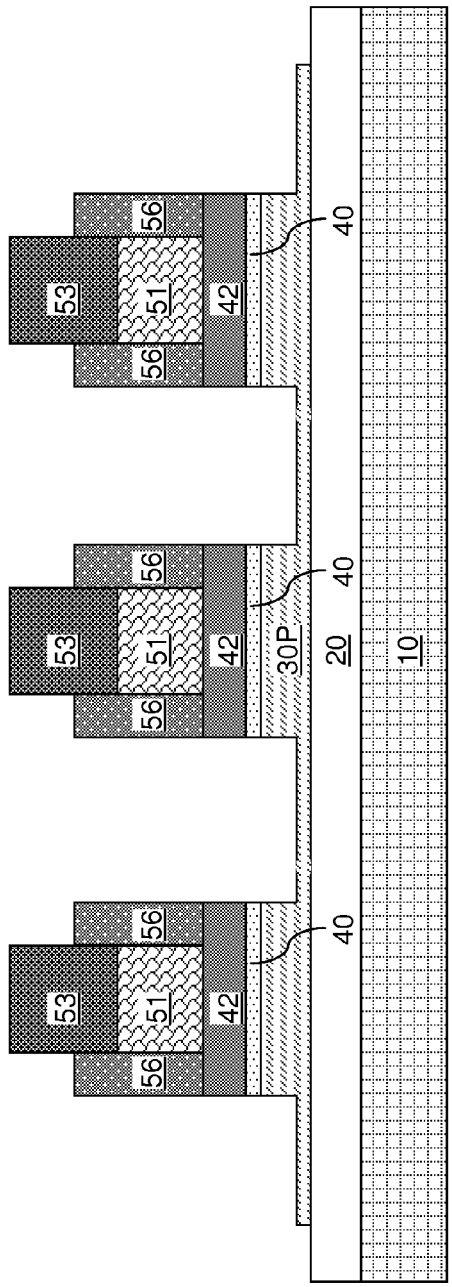
FIG. 16 is a vertical cross-sectional view of the second exemplary semiconductor structure after recessing portions of the patterned semiconductor material layer that are not covered by the disposable gate structure or by the gate spacer according to an embodiment of the present disclosure.

Referring to FIG. 16, portions of the patterned semiconductor material layer 30P that are not covered by the disposable gate structures 51 or by the gate spacers 56 are recessed employing the processing steps of FIGS. 5A, 5B, 5C, and 5D. Some of the recessed regions of the patterned semiconductor material layer 30P can have a first sidewall that is vertically coincident with an outer sidewall of a first gate spacer 56 and a second sidewall that is vertically coincident with an outer sidewall of a second gate spacer 56, i.e., laterally bounded by a pair of gate spacers 56.

Figure 17:
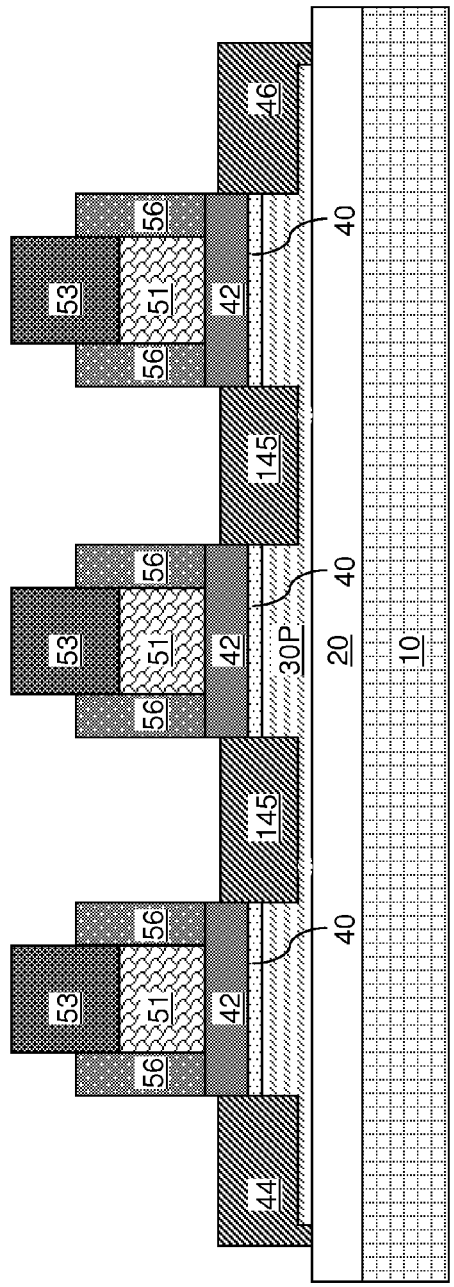
FIG. 17 is a vertical cross-sectional view of the second exemplary semiconductor structure after selective epitaxial growth of stress-generating semiconductor portions according to an embodiment of the present disclosure.

Referring to FIG. 17, stress-generating semiconductor portions are formed by selective epitaxial growth employing the processing steps of FIGS. 6A, 6B, 6C, and 6D. The stress-generating semiconductor portions can include, for example, a first stress-generating semiconductor portion 44, a second stress-generating semiconductor portion 46, and additional stress-generating semiconductor portions 145 that are embedded within the stack of the patterned semiconductor material layer 30P, the optional dielectric pads 40, and the plurality of fin-defining mask structures 42. The additional stress-generating semiconductor portions 145 are fully embedded stress-generating semiconductor portions that do not any have free-standing lateral surface, i.e., all lateral surfaces of the additional stress-generating semiconductor portions 145 are laterally contacted by a material portion, thereby preventing stress relaxation in lateral directions through volume changes. Thus, the effectiveness of the additional stress-generating semiconductor portions 145 is enhanced for the purpose of generating a lateral stress, i.e., for the purpose of applying a lateral stress to channels of fin field effect transistors.

Each of the additional stress-generating semiconductor portions 145 can be formed as a portion of a source region, as a portion of a drain region, or as a portion of a common node that functions as a source region for one fin field effect transistor and as a drain region for another adjoining fin field effect transistor, or as a portion of a variable functionality node that functions as a source region in one operational mode and as a drain region in another operational mode.

Referring to FIGS. 18A and 18B, additional processing steps of FIGS. 7A-7D, 8A-8D, 9A-9D, 10A-10D, 11A-11D, 12A-12D, and 13A-13D can be performed. Particularly, various metal semiconductor alloy portions (54, 55, 155) can be formed on the physically exposed semiconductor surfaces of the first stress-generating semiconductor portion 44, the second stress-generating semiconductor portion 46, and the additional stress-generating semiconductor portions 145. Various contact via structures (74, 75, 76) can be formed to provide electrical contact with various components of a fin field effect transistor, which includes a plurality of channels within the plurality of semiconductor fins 30F. The various contact via structures can include, for example, a gate contact via structure 72 that contacts the gate electrode 52, a first source/drain contact via structure 74 that contacts the first metal semiconductor alloy portion 54 or the first stress-generating semiconductor portion 44, a second source/drain contact via structure 76 that contacts the second metal semiconductor alloy portion 55 or the second stress-generating semiconductor portion 46, and additional contact via structures 75 that contact additional metal semiconductor alloy portions 155 or the additional stress-generating semiconductor portions 145, respectively.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A semiconductor structure comprising:
a fin-containing semiconductor portion that includes a plurality of semiconductor fins, a first end portion, and a second end portion, each of said plurality of semiconductor fins, said first end portion, and said second end portion comprising a first semiconductor material, wherein each semiconductor fin among said plurality of semiconductor fins extends along a lengthwise direction and is laterally spaced from one another along a widthwise direction perpendicular to said lengthwise direction, and one end of each of said plurality of semiconductor fins is longitudinally adjoined to said first end portion and another end of each of said plurality of semiconductor fins is longitudinally adjoined to said second end portion, wherein each of said first end portion and said second end portion includes a proximal portion having a topmost surface that has a same height as a topmost surface of each of said plurality of semiconductor fins, and includes a distal portion having a topmost surface that has a lesser height than said topmost surface of each of said plurality of semiconductor fins, said proximal portion of each of said first end portion and said second end portion adjacent to said plurality of semiconductor fins;
a first stress-generating semiconductor portion in contact with said distal portion of said first end portion and an outer sidewall of said proximal portion of said first end portion and comprising a second semiconductor material having a different lattice constant than said first semiconductor material and epitaxially aligned to said first end portion; and
a second stress-generating semiconductor portion in contact with said distal portion of said second end portion and an outer sidewall of said proximal portion of said second end portion and comprising said second semiconductor material and epitaxially aligned to said second end portion.

2. The semiconductor structure of claim 1, wherein said first stress-generating semiconductor portion is in contact with an entirety of a top surface of said distal portion of said first end portion and a sidewall surface of said first end portion, and said second stress-generating semiconductor portion is in contact with an entirety of a top surface of said distal portion of said second end portion and a sidewall surface of said second end portion.

3. The semiconductor structure of claim 1, further comprising a buried insulator layer comprising a dielectric material and having a planar top surface, wherein an entirety of a bottom surface of said fin-containing semiconductor portion laterally extending from a sidewall surface of said distal portion of said first end portion to a sidewall surface of said distal portion of said second end portion is in contact with said planar top surface.

4. The semiconductor structure of claim 1, further comprising a gate dielectric in contact with a lengthwise sidewall of said plurality of semiconductor fins.

5. The semiconductor structure of claim 4, further comprising a gate electrode overlying said plurality of semiconductor fins and in contact with said gate dielectric.

6. The semiconductor structure of claim 1, wherein an entire top surface of said first stress-generating semiconductor portion and an entire top surface of said second stress-generating semiconductor portion are within a same horizontal plane.

7. The semiconductor structure of claim 1, further comprising:
a first gate spacer portion overlying said proximal portion of said first end portion and having a same thickness as a lateral extent of said proximal portion of said first end portion along said lengthwise direction of said plurality of semiconductor fins; and
a second gate spacer portion overlying said proximal portion of said second end portion and having a same thickness as a lateral extent of said proximal portion of said second end portion along said lengthwise direction of said plurality of semiconductor fins.

8. The semiconductor structure of claim 1, further comprising a plurality of fin-defining mask structures overlying said plurality of semiconductor fins, said plurality of semiconductor fins has a same width as said plurality of fin-defining mask structures.

9. The semiconductor structure of claim 8, wherein said plurality of fin-defining mask structures comprises a dielectric material.

10. The semiconductor structure of claim 8, wherein said first stress-generating semiconductor portion is in contact with a sidewall of each of said plurality of fin-defining mask structures, and said second stress-generating semiconductor portion is in contact with another sidewall of each of said plurality of fin-defining mask structures.

11. The semiconductor structure of claim 1, wherein said topmost surfaces of said proximal portions are surfaces of said first semiconductor material, and said topmost surfaces of said distal portions are additional surfaces of said first semiconductor material.

12. The semiconductor structure of claim 1, wherein said fin-containing semiconductor portion consists of said first semiconductor material and electrical dopant atoms.

13. The semiconductor structure of claim 1, wherein an entire bottom surface of said fin-containing semiconductor portion bounded by a periphery adjoining sidewalls of said fin-containing semiconductor portion is within a horizontal plane.

14. The semiconductor structure of claim 1, wherein said topmost surfaces of said distal portions are interfaces with bottom surfaces of said first stress-generating semiconductor portion and said second stress-generating semiconductor portion.

15. The semiconductor structure of claim 7, wherein an outer sidewall of said first gate spacer portion is vertically coincident with said sidewall of said proximal portion of said first end portion, and an outer sidewall of said second gate spacer portion is vertically coincident with said sidewall of said proximal portion of said second end portion.

16. The semiconductor structure of claim 1, wherein an entire bottom surface of said fin-containing semiconductor portion is within a horizontal plane, and said fin-containing semiconductor portion consists of a first region having a first height and two second regions having a second height that is less than said first height, wherein said first region consists of said plurality of semiconductor fins, said proximal portion of said first end portion, and said proximal portion of said second end portion.

17. The semiconductor structure of claim 16, wherein said second region consists of said distal portion of said first end portion and said distal portion of said second end portion.

18. The semiconductor structure of claim 1, wherein said first stress-generating semiconductor portion is in contact with a sidewall of said distal portion of said first end portion, and said second stress-generating semiconductor portion is in contact with a sidewall of said distal portion of said second end portion.

19. The semiconductor structure of claim 18, wherein said sidewall of said distal portion of said first end portion is more distal than said plurality of semiconductor fins than said sidewall of said proximal portion of said first end portion.

20. The semiconductor structure of claim 8, wherein each sidewall of said plurality of fin-defining mask structures is vertically coincident with a corresponding outer sidewall of said first gate spacer portion and said second gate spacer portion.

* * * * *